United States Patent [19]

Fowks

[11] 4,434,406
[45] Feb. 28, 1984

[54] LAMP HOUSING ASSEMBLY PRIMARILY FOR THE LAMP OF A RUBIDIUM FREQUENCY STANDARD

[75] Inventor: William R. Fowks, Yorba Linda, Calif.

[73] Assignee: Rockwell International Corporation, El Segundo, Calif.

[21] Appl. No.: 291,606

[22] Filed: Aug. 10, 1981

[51] Int. Cl.³ ............................................. H03L 7/26
[52] U.S. Cl. .................................... 331/3; 331/94.1; 313/550
[58] Field of Search ................... 331/3, 94.1; 324/304, 324/305; 313/567, 572, 573, 607, 628, 112, 550; 315/85, 114, 117, 248

[56] References Cited

U.S. PATENT DOCUMENTS 3,109,960 11/1963 Bell et al. ....................... 313/112 X
4,095,142 6/1978 Murayama et al. ............ 313/607 X Primary Examiner—Stanley D. Miller
Assistant Examiner—W. R. Paxman
Attorney, Agent, or Firm—H. Fredrick Hamann; Richard A. Bachand

[57] ABSTRACT

A lamp assembly primarily for a rubidium frequency standard and having an improved lamp housing configuration including a cast metal housing which acts as an RF shield for the lamp ignition helical coil resonator. The lamp is heated by both a conventional bipolar heater transistor and a heater blanket made of Nichrome etched Inconel encased in a Kapton impregnated fiberglass laminate material, to reduce warm-up time and more reliably distribute the heating function.

15 Claims, 19 Drawing Figures

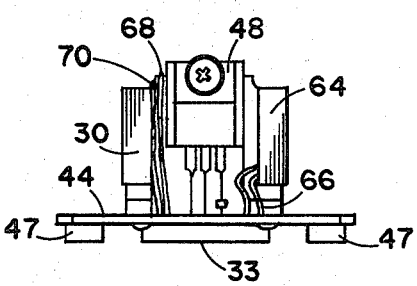
FIG. 11
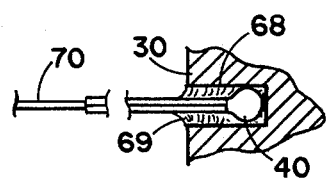
FIG. 12
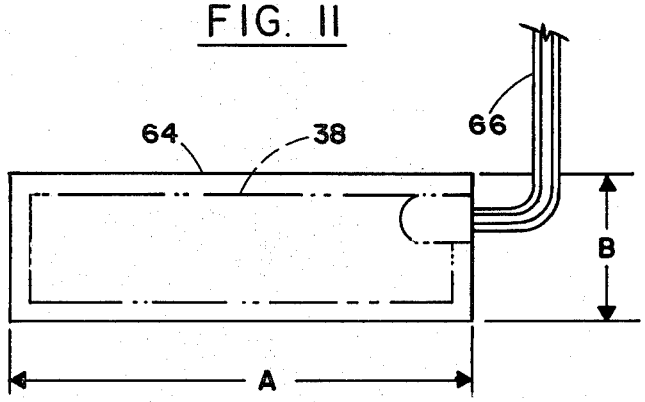
FIG. 13
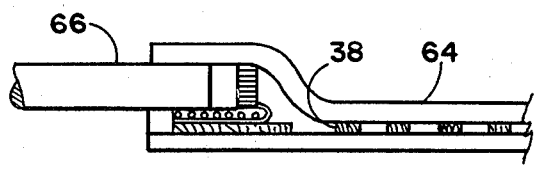
FIG. 14
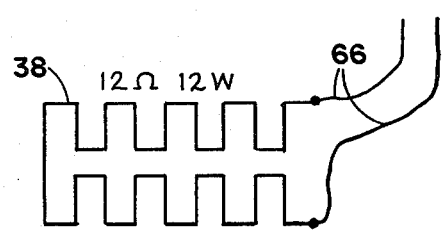
FIG. 15
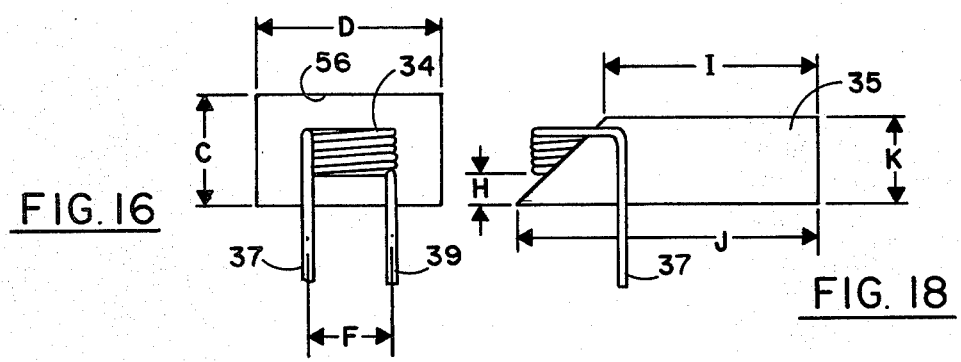
FIG. 16
FIG. 18
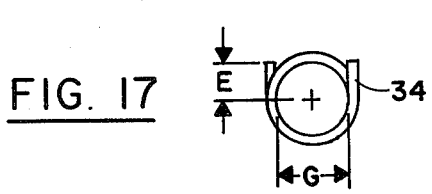
FIG. 17
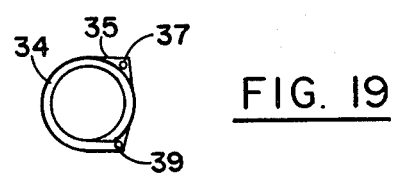
FIG. 19

LAMP HOUSING ASSEMBLY PRIMARILY FOR THE LAMP OF A RUBIDIUM FREQUENCY STANDARD

BACKGROUND OF THE INVENTION

1. Field of the Invention

The present invention relates to atomic stabilized frequency sources and more particularly to an improved housing for the lamp and associated circuitry for a rubidium frequency standard.

2. Prior Art

Although the present invention may find practical application in any one of numerous atomic stabilized frequency sources, it is particularly adaptable for operation in a rubidium vapor cell frequency standard. Rubidium vapor cell frequency standards, as well as other types of atomic stabilized frequency sources, are described extensively in the literature. For example, reference may be had to the texts respectively entitled, "Frequency and Time" by P. Kartaschoff, Academic Press, 1978; and "Frequency Synthesizers Theory and Design", Second Edition by Vadim Manassewitsch, John Wiley & Sons, 1980. Such frequency sources are stabilized by quantum mechanical atomic state transition resonances such as the hyperfine atomic resonance frequency related to the change in the internal energy of the atom. A rubidium frequency standard operates as a descriminator based upon the energy absorption characteristics of rubidium-87. In practice, a rubidium lamp passes a light beam into a rubidium absorption cell. The rubidium cell absorbs some of the light energy because of the energy level transitions in the rubidium-87 gas. When an electromagnetic field frequency equal to the resonance frequency of the rubidium vapor is applied to the vapor cell, the number of energy level transitions in the rubidium-87 gas is increased and more of the light emitted by the rubidium lamp is absorbed by the rubidium vapor cell. Typically, a photodiode is used to detect the occurrence of the maximum absorption of light from the rubidium lamp which occurs when the frequency of the excitation electromagnetic field exactly matches the rubidium resonance frequency. Typically, a frequency synthesizer is used to generate the appropriate electromagnetic field frequency of approximately 6,834.685 MHz. This field frequency is modulated at a relatively slow rate (i.e., 154 Hz.) so that the photodiode provides a demodulated signal which may be applied to a phase detector or comparator which also receives a reference modulation signal. The output of the phase comparator is a DC error voltage which is used to control a voltage variable crystal oscillator at a selected frequency, typically of 5 or 10 MHz. In this manner, the frequency of the crystal oscillator is stabilized to approximately one part in $10^{11}$ or better over long periods of time to provide a highly stable and accurate frequency source.

Ignition and subsequent controlled operation of the rubidium lamp requires both radio frequency field excitation coupling (because it is an electrodeless lamp) and good thermal coupling to a temperature controlled heater. Because the RF power required to ignite and maintain the lamp discharge is relatively high (on the order to 2 watts DC input to an RF circuit in the preferred embodiment) for a compact frequency standard, a substantial degree of RF shielding is required to avoid interference between the RF signal and other circuits of the standard.

Those familiar with the art to which the present invention pertains will appreciate the requirement for utilizing an active heater element in conjunction with the lamp in order to raise the operating temperature to a suitable point for proper ignition and discharge with the requisite degree of intensity and proper spectral components. In the embodiment of the invention disclosed herein, lamp operating temperature is 137 degrees C. This high temperature would normally place a severe strain on the active heater element, typically, a bi-polar transistor in the prior art, because of approaching the secondary breakdown limit of the transistor. Furthermore, in the prior art, the housing for a rubidium lamp typically includes a gap or slot to avoid the effect of a shorted turn with respect to the discharge igniting coil contained within the housing. As a result the use of any kind of thermal material around the housing that requires good bonding thereto would be precluded by the slot in the housing.

As a result of the above-noted disadvantages of prior art lamp housing and associated field excitation and heating techniques, it has been necessary in the past to make a variety of mechanical and electrical assembly trade-offs in lamp structure design, particularly for rubidium frequency standards of compact size. Consequently, comparable prior art devices have had to be designed to accommodate such constraints by either making the frequency standard larger and more expensive, or less reliable and durable and subject to greater maintenance costs.

SUMMARY OF THE INVENTION

The present invention provides a housing configuration for the lamp of a rubidium frequency standard which configuration overcomes or substantially reduces the disadvantages of the prior art by providing a lamp housing that includes a heater blanket in series electrically with the heater transistor and which permits the tailoring of the power distribution for heating between the blanket and the transistor, thus providing a much greater margin of safe operation for the heating transistor with the additional benefit of a faster warm-up time. In addition, the housing per se of the present invention is a simple inexpensive casting which is used as an RF shield for an enclosed helical RF coil providing an electrically high Q assembly which results in easy lamp ignition without the usual prior art gap or slot. The entire assembly is mounted on a Teflon printed circuit board to preclude scorching at the high operating temperature of the lamp. Thus it will be seen that the present invention provides a unique housing configuration for the lamp of a rubidium frequency standard which employs a number of novel and advantageous features which render the lamp, and thus the frequency standard in which it is employed, more durable and reliable, less costly, and still capable of being packaged in a compact assembly.

OBJECTS

It is therefore a primary object of the present invention to provide a rubidium frequency standard which incorporates an improved lamp housing configuration that overcomes and/or substantially reduces the aforementioned disadvantages of the prior art.

It is another object of the present invention to provide an improved lamp housing for the lamp of a rubidium frequency standard and which precludes the prior art necessity for disadvantageous mechanical and electrical assembly trade-offs.

It is still an additional object of the present invention to provide an improved housing configuration for the lamp of a rubidium frequency standard, which housing employs a heater transistor as well as a heater blanket comprising a Nichrome etched Inconel foil in a Kapton film laminate and which is series connected with the heater transistor to permit tailoring the power distribution between the blanket and the transistor to provide faster lamp warm-up time and improved reliability while allowing relatively high lamp operating temperatures.

It is still a further object of the present invention to provide an improved housing configuration for the lamp of a rubidium frequency standard in which the housing is used as an RF shield for an enclosed helical RF coil used to ignite the lamp, the coil providing a helical design having an electrically high Q (i.e., approximately 500), which provides for easy lamp ignition without the prior art necessity for a slot or gap in the housing.

It is still a further object of the present invention to provide an improved housing configuration for the lamp of a rubidium frequency standard which includes a housing made of a simple inexpensive casting rather than a machine part and which is mounted on a Teflon printed circuit board thereby reducing the cost of the housing configuration and increasing the durability and reliability of the assembly.

It is still a further object of the present invention to provide an improved housing configuration for a rubidium frequency standard which is easily manufactured, readily maintainable, more reliable than the prior art and is of a modular configuration adapted for use in a compact frequency standard package.

BRIEF DESCRIPTION OF THE DRAWINGS

The aforementioned objects and advantages of the present invention, as well as additional objects and advantages thereof, will be more fully understood hereinafter as a result of the detailed description of the presently preferred embodiment of the invention when taken in conjunction with the accompanying drawings in which:

FIG. 11 is a front view of the housing of the present invention shown with a heating transistor, heater blanket and thermistor connected therein and also connected to the printed circuit board of the invention;

FIG. 12 is a cross sectional enlarged view of the thermistor of the present invention shown installed in the housing;

FIG. 13 is a plan view of the heater blanket structure of the present invention;

FIG. 14 is a side cut-away view of the heater blanket portion of the present invention;

FIG. 5 is a schematic representation of the heater element of the heater blanket of the present invention; and FIGS. 16-19 are simplified structural views of the lamp ignition coil of the present invention.

DETAILED DESCRIPTION OF A PREFERRED EMBODIMENT

Figure 1:
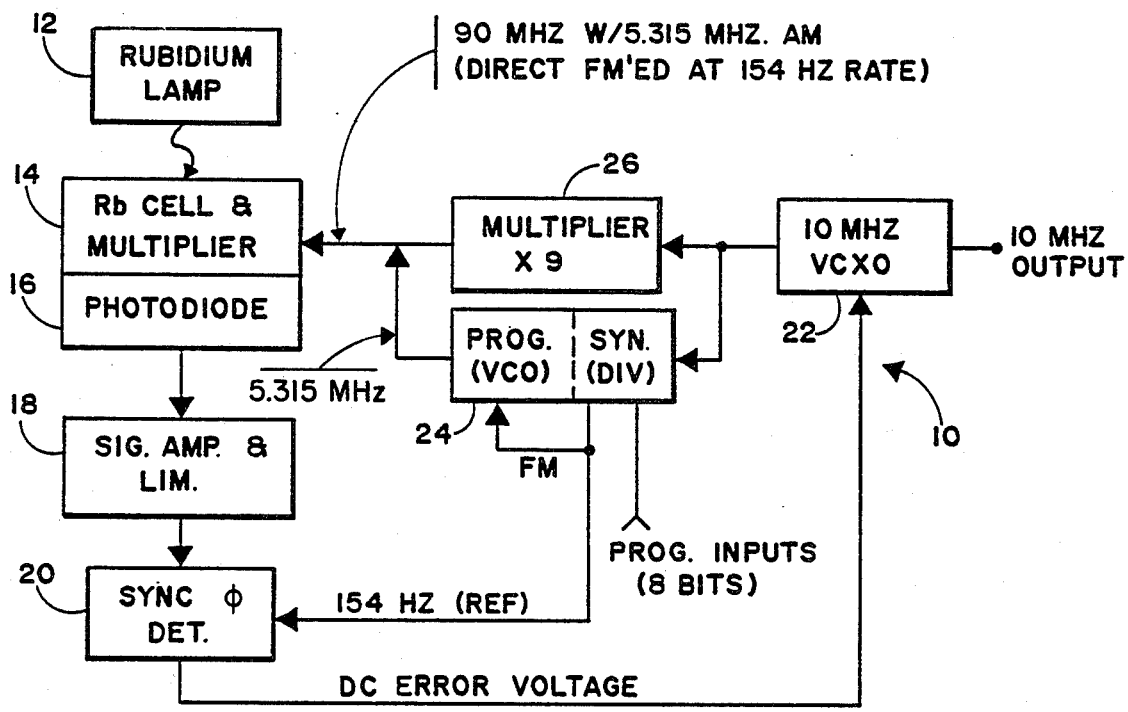
FIG. 1 is a simplified block diagram of a rubidium frequency standard in which the improved lamp housing configuration of the present invention may be utilized.

Referring to FIG. 1 there is shown a simplified block diagram of a rubidium frequency standard 10 employing an improved lamp housing configuration in accordance with the present invention. More specifically, and as is well-known in the art, the rubidium frequency standard 10 utilizes a rubidium lamp 12 to generate a beam of light. The lightbeam is directed through a rubidium vapor cell and multiplier 14 and is incident upon a photodiode 16. The output of the photodiode is connected to a signal amplifier and limiter 18 which is, in turn, connected to a synchronous phase detector 20. Synchronous phase detector 20 develops a DC error voltage which is applied to a 10 MHz voltage controlled crystal oscillator 22 to adjust the precise frequency thereof. Crystal oscillator 22 provides a nominal 10 MHz output signal which is the externally accessible output of the rubidium frequency source 10. Crystal oscillator 22 also provides output signals to a programmable frequency synthesizer 24 and to a X9 frequency multiplier 26.

Synthesizer 24 generates a phase locked 154 Hz periodic signal that is applied as a reference signal to synchronous phase detector 20 and which is also applied as a frequency modulating signal to a phase locked voltage controlled oscillator internal to the synthesizer. The output of this internal voltage controlled oscillator is a periodic signal of approximately 5.315 MHz which is summed with the 90 MHz output signal of multiplier 26. That combination of signals is applied to rubidium cell and multiplier 14. The lower sideband of the 76th harmonic of the 90 MHz signal output of multiplier 26 (amplitude modulated by the 5.315 MHz output of the synthesizer), generated by the non-linear characteristics of a snap diode multiplier, corresponds to the resonance frequency of the hyperfine atomic state transition of the rubidium cell.

As is well-known in the art to which the present invention pertains, when the frequency of the applied electromagnetic field matches the resonance frequency of the rubidium cell, the maximum number of energy transitions occur and the maximum absorption of rubidium-87 light is produced in the rubidium cell. Accordingly, the effect of the 154 Hz frequency modulation of the lower sideband of the 90 MHz output of multiplier 26 (amplitude modulated by the 5.315 MHz output of the synthesizer 24), is a photodiode output signal which is composed of a combination of a 154 Hz fundamental frequency and a second harmonic at a frequency of 308 Hz. When the resonance frequency of the rubidium cell is matched precisely by the frequency of the applied electromagnetic radiation, the fundamental modulation frequency of 154 Hz is, in effect, zeroed out and only the 308 Hz second harmonic remains. On the other hand, if precise matching of the frequency of the electromagnetic radiation and the resonance of the cell is not achieved, the fundamental modulation frequency at 154 Hz is produced by the photodiode, with a phase dependent upon whether the frequency of the applied electromagnetic radiation is above or below the resonance frequency of the cell. The photodiode output signal is applied to the signal amplifier and limiter 18 and thereafter to synchronous phase detector 20. Detector 20 compares the photodiode output signal with a 154 Hz reference signal as derived from frequency synthesizer 24. The detector thus provides a DC error voltage, the magnitude and polarity of which may be used to accurately track the frequency of the 10 MHz voltage controlled crystal oscillator 22 to the resonance frequency of the rubidium cell.

As further indicated in FIG. 1, programmable frequency synthesizer 24 includes provision for programmable inputs comprising 8 bits of binary code for controlling the frequency thereof. Furthermore, the synthesizer provides the 154 Hz reference signal to synchronous phase detector 20 to develop the DC error signal applied to crystal oscillator 22. It also provides means for directly frequency modulating an internal VCO for developing the frequency modulated 5.315 MHz signal that is summed with the output of multiplier 26 and is eventually used to derive the precise electromagnetic field frequency applied to the rubidium cell and multiplier 14.

Figure 2:
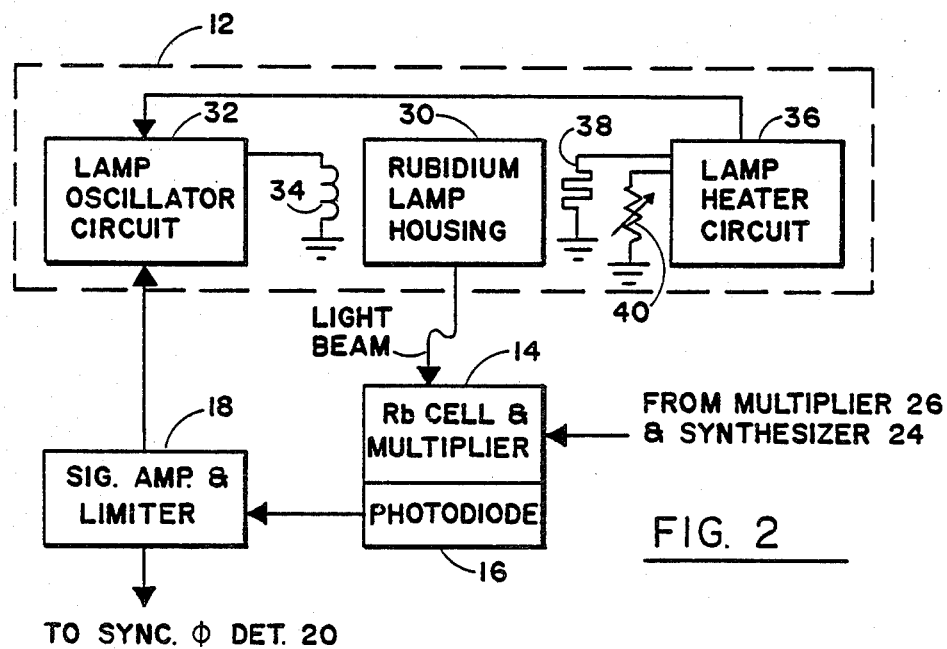
FIG. 2 is a simplified block diagram of a rubidium lamp assembly of the present invention including the novel lamp housing configuration thereof and illustrating the electrical interconnection with other circuits in the rubidium frequency standard.

The electrical configuration of rubidium lamp 12 as well as its interconnection with other portions of the rubidium frequency standard 10 are shown in somewhat more detail in the block diagram of FIG. 2. More specifically, it is shown in FIG. 2 that rubidium lamp 12 actually comprises a rubidium lamp housing 30 and a lamp heater circuit 36 which provides heating power to a heater 38, the temperature of which is monitored by a thermistor 40. As also indicated, rubidium lamp housing 30 produces a light beam which is incident upon rubidium cell and multiplier 14 and photodiode 16. Photodiode 16, as indicated previously in conjunction with FIG. 1, provides a signal input to signal amplifier and limiter 18 which is, in turn, used to provide the signal to synchronous phase detector 20. However, signal amplifier and limiter 18 also provides a feedback signal to the lamp oscillator circuit 32 the purpose of which is fully disclosed in co-pending patent application Ser. No. 284,416 filed July 20, 1981. An additional feedback circuit connects lamp heater circuit 36 and lamp oscillator circuit 32. The purpose of this feedback circuit is also disclosed in detail in the aforementioned co-pending patent application.

Figure 3:
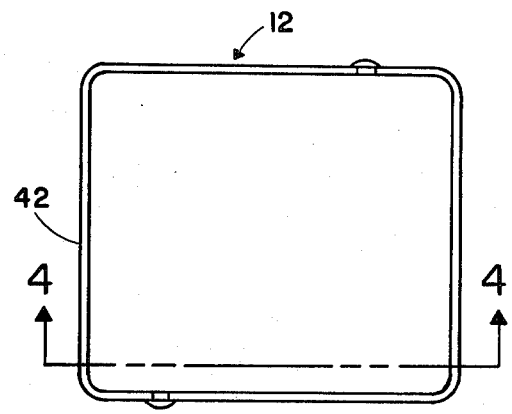
FIG. 3 is a simplified exterior view of the modular chassis of the lamp assembly using the present invention.
Figure 4:
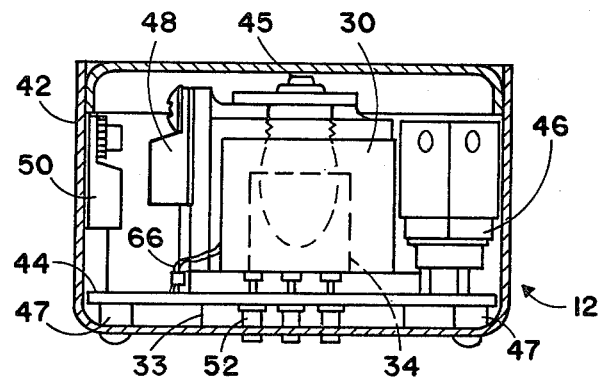
FIG. 4 is a sectional view of the modular lamp assembly utilizing the present invention and taken along lines 4—4 of FIG. 3.
Figure 5:
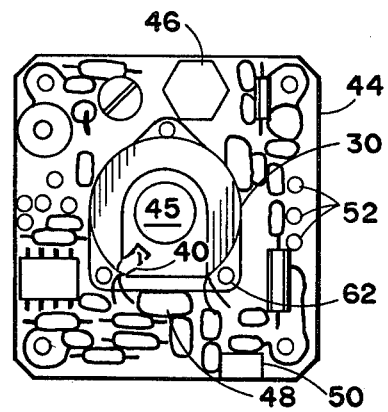
FIGS. 5 and 6 are top and bottom views respectively of the assembly of the present invention including the lamp housing per se and the printed circuit board on which it is mounted.
Figure 6:
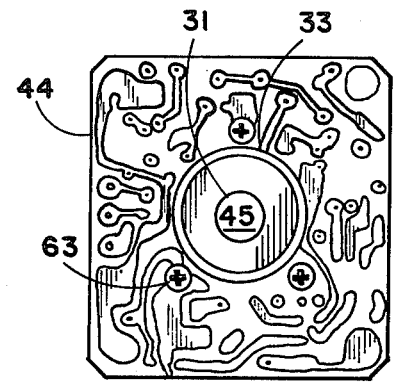

The actual physical configuration of the present invention may be best understood by reference to FIGS. 3 through 19 which shall now be described in detail. More specifically, the modular configuration of the rubidium lamp assembly 12 is illustrated in FIGS. 3 and 4 wherein FIG. 3 is a simplified illustration of the modular configured, substantially rectangular assembly chassis 42 and wherein FIG. 4 is a cut-away view of the interior of the chassis 42 illustrating the assembled configuration of rubidium lamp assembly 12 including the present invention. More specifically, included in chassis 42 is a printed circuit board 44 upon which is mounted the lamp housing 30 of the present invention along with an RF oscillator high power transistor 46, a voltage regulator 50 and a plurality of externally accessible connectors 52. Also shown is a heating transistor 48 which is mechanically attached to the housing 30 to provide one of the two sources of heating power to raise the temperature of the rubidium lamp to the selected operating level. The lamp itself, that is, the transparent bulb 45 which includes the rubidium and carrier gases which provide the light discharge at the selected temperature and RF field excitation, is shown extending into the housing 30 with the sealed end thereof extending above the top of the housing. Also shown are a pair of wire leads 66 which interconnect the heater blanket 64 (FIGS. 9-11) of the present invention and the printed circuit board 44. Of course it will be understood that there are numerous other electrical components mounted to circuit board 44, but which are not shown in FIG. 4 for purposes of clarity. Those additional components and their electrical interconnections, along with the housing assembly of the present invention, are shown in FIGS. 5 and 6 which are top and bottom views, respectively, of the fully assembled circuit board 44 including the housing of the invention. The actual components and interconnections utilized on circuit board 44 comprising lamp oscillator circuit 32 and lamp heater circuit 36 are disclosed in co-pending patent application Ser. No. 284,416 filed on July 20, 1981 in behalf of the same applicant and assignee hereof.

Figure 7:
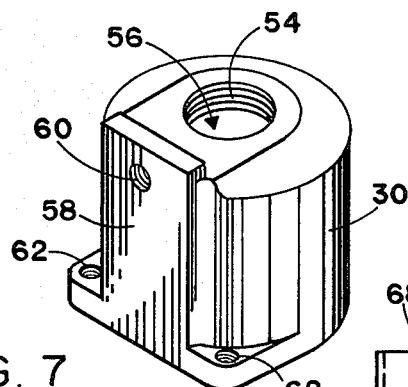
FIG. 7 is a three dimensional view of the lamp housing of the present invention.
Figure 8:
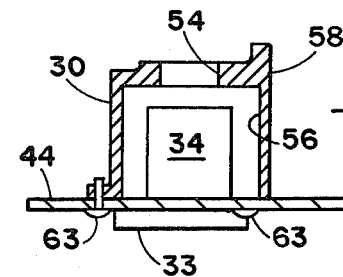
FIG. 8 is a cross sectional side view of the housing of the present invention.

It is seen in FIGS. 5 through 11 that housing 30 is, substantially, a circular cylinder with a flattened face 58 on one side thereof. Flat face 58 is designed to receive heater transistor 48 with maximum surface contact between the transistor and housing 30. Housing 30 is hollowed out to form an interior chamber 56 to which access is provided at the top of housing 30 by means of a threaded aperture 54. An additional aperture at the bottom surface of housing 30 provides an exit hole for the rubidium light beam discharged in lamp 45. A corresponding aperture 31 in circuit board 44 provides a light path for that lightbeam for transmission to rubidium cell and multiplier 14 as discussed previously in conjunction with FIGS. 1 and 2. Housing 30 is adapted to be secured to printed circuit board 44 by three screws 63 which are adapted to be received by threaded screw holes 62 through circuit board 44 as seen best in FIGS. 7 and 8. Also seen in FIGS. 7 and 8 is the substantially cylindrical inner chamber 56 of the housing 30 including an outline of the RF coil 34 which is discussed in more detail below in conjunction with FIG. 16. A nylon ring 33 is affixed to the bottom of circuit board 44 in symmetrical relation to aperture 31 to provide added support and resistance to vibration. Four spacers 47 also provide support for the circuit board 44 within chassis 42.

Figure 9:
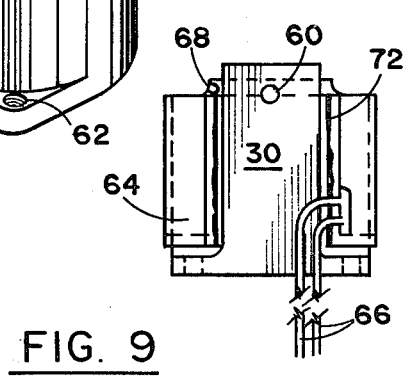
FIGS. 9 and 10 are front and top views respectively of the housing of the present invention illustrating the manner in which a heater blanket and thermistor are integrated therewith.
Figure 10:
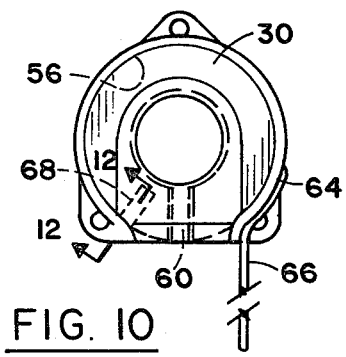

Housing 30 also includes an aperture 68 seen in the front view of FIG. 9 which is adapted to receive thermistor 40 as shown in FIG. 5. As shown further in FIG. 10 aperture 68 is cylindrical in shape and extends partially towards the center of the cylinder forming housing 30 at about the intersection of flat face 58 with the circular perimeter of the housing. As shown in the enlarged scale sectional view of FIG. 12 thermistor 40 is located substantially concentric within aperture 68 and is bottomed out against the inner-most wall of the aperture. The aperture is filled with a metalized non-conductive adhesive 69. The thermistor wires 70 are preferably Teflon sleeved and brought out a sufficient length to permit electrical connection of the thermistor to the circuit board as shown in FIG. 5.

Heater blanket 64 is wrapped around the circular periphery of housing 30 and bonded thereto by means of an adhesive tape (not shown). The edges of blanket 64 are then secured by an adhesive such as RTV 3145. The heater blanket is connected to the printed circuit board by means of a pair of wires 66 which place heater blanket 64 in series with the emitter junction of heater transistor 48 secured to flat face 58 of housing 30. In this manner, heater power is applied to both transistor 48 and heater blanket 74 to more evenly distribute the heater power around the periphery of the housing thus providing means for operating the rubidium lamp at elevated temperatures without approaching the thermal operating limit of heater transistor 48.

Reference will now be made to FIGS. 13 through 15 for a more detailed description of the heater blanket of the present invention. Heater 38 consists of an Inconel foil chemically etched with a Nichrome heating element and encased in a Kapton or silicon rubber impregnated fiberglass film laminate forming heater blanket 64. Blanket 64 is flexible and designed to be wrapped around and adhered to the circular surface of housing 30. The Inconel heating element is geometrically configured as a dual bifilar circuit interlaced for minimum inductance and cancellation of magnetic field. A pair of Teflon coated interconnecting wires 66 are fusion welded to the Inconel foil to connect heater blanket 64 to the printed circuit board 44 in series with heater transistor 48. As shown in the schematic diagram of FIG. 15, the heater blanket is capable of evenly dissipating 12 watts and has an equivalent resistance of 12 Ohms. The heater blanket is adhered to the circular outer wall of housing 30 by means of a high temperature dual-sided tape (not shown) that is typically cured at 250 degrees F. for thirty minutes. In order to be sure that the heater blanket edges at the intersection of flat wall 58 are permanently secured to the housing, a bead 72 (FIG. 9) of RTV compound is normally applied at such edges.

FIGS. 16 through 19 provide a detailed representation of the structure of RF field coil 34 which is used to ignite the discharge in lamp bulb 45. As shown in FIGS. 16 through 19, field coil 34 is a close wound helical coil of $5\frac{3}{4}$ turns. The resonance frequency is determined in part by the inside dimensions of the housing cavity 56 in conjunction with the ground plane surface on circuit board 44 on which the housing 30 rests. The coil 34 including the vertical leads 37 and 39 thereof, are wound within a glass epoxy tape 35 that is high temperature baked and cured to form a rigid cylindrical structure enclosing the coil. For purposes of providing a complete disclosure of the present invention, Table I below provides a list of typical dimensions for the preferred embodiments of heater blanket 64 and coil 34 of the present invention.

TABLE I

| DIMENSION | INCHES |
| --- | --- |
| A | 2.5 |
| B | 0.65 |
| C | 0.75 |
| D | 0.93 |
| E | 0.25 |
| F | 0.50 |
| G | 0.45 |
| H | 0.20 |
| I | 2.15 |
| J | 2.85 |
| K | 0.60 |

It will now be understood that what has been disclosed herein is an improved novel lamp housing configuration for a rubidium frequency standard including a number of unique features. One such feature comprises a heater blanket of Nichrome etched Inconel foil encased in a Kapton or silicon rubber impregnated fiberglass film laminate. The heater blanket shares the burden of heating the rubidium lamp to the proper operating temperature with the conventional transistor heater to increase the reliability and decrease the warm-up time of the rubidium lamp assembly. The heater blanket is wrapped around a cast metal lamp housing used as an RF shield enclosing an RF helical coil to result in a high Q assembly for easy lamp ignition, without any need for a gap or slot in the housing to avoid the effects of a shorted turn. Another feature of the present invention is the use of a Teflon printed circuit board on which the housing is mounted along with the lamp heater circuits and lamp oscillator circuits to complete the modular assembly of the present invention.

Although a preferred embodiment of the invention has been disclosed herein, those having skill in the art to which the present invention pertains will understand that various modifications and additions may be made thereto without deviating from the contemplated scope of the invention. By way of example, although specific materials have been disclosed as well as specific shapes and dimensions, it will be understood that variations in such materials, shapes and dimensions may be made without deviating from the scope of the invention which is to be limited only by the appended claims.

I claim:

1. A lamp assembly for use in an atomic frequency standard of the type used for stabilizing a frequency source by tracking it to a hyperfine transition resonance of an atomic frequency resonator having a source of light for optically pumping a resonance cell and a photodiode for detecting resonance, said lamp assembly, for igniting a light discharge in said source of light, comprising;

a field coil in proximity to said source of light, means for generating a periodic signal through said coil at a selected frequency, and a housing of substantially cylindrical cross-section and having a chamber therein for containing said source of light and said field coil in substantially symmetrical relation, said housing and said coil cooperating electrically to form a light ignition resonator having a resonance frequency approximately equal to said selected frequency, said housing providing the RF shield of said ignition resonator, said housing chamber being of circular cross-section and the external cross-section of said housing being circular around a majority of the perimeter thereof and flat along the remainder of the perimeter thereof.

2. The lamp assembly recited in claim 1 wherein said field coil is a helical coil and wherein said ignition resonator provides a Q of at least approximately 500 at said selected frequency.

3. The lamp assembly recited in claim 1 wherein said housing is a metal casting.

4. The lamp assembly recited in claim 1 further comprising:
a first heat generating device connected to said housing and in intimate contact therewith on said flat perimeter portion of said housing.

5. The lamp assembly recited in claim 4 further comprising:
a second heat generating device connected to said housing and in intimate contact therewith along said circular perimeter portion of said housing.

6. The lamp assembly recited in claim 5 wherein said first heat generating device is a transistor and wherein said second heat generating device is a heater blanket.

7. The lamp assembly recited in claim 6 wherein said heated blanket comprises:
an electrically conductive foil encased in an electrically non-conductive laminate material and is adapted to cover said circular perimeter portion of said housing over substantially the entire area thereof.

8. The lamp assembly recited in claim 7 wherein said foil is Inconel etched with Nichrome and wherein said laminate material is Kapton-impregnated fiberglass film.

9. The lamp assembly recited in claims 1, 2, 3, 4, 5, 6, 7, or 8 further comprising a Teflon printed circuit board upon which said housing is mounted.

10. The lamp assembly recited in claim 9 further comprising a cured glass epoxy tape surrounding said coil in supporting intimate engagement therewith.

11. The lamp assembly recited in claims 1, 2, 3, 4, 5, 6, 7, or 8 wherein said frequency standard is of the rubidium vapor cell type and wherein said source of light is a rubidium lamp.

12. An improved lamp assembly for igniting a discharge in a rubidium lamp in a rubidium vapor cell frequency standard of the type used for stabilizing a frequency source by tracking it to hyperfine resonance of a rubidium vapor cell resonator optically pumped by a rubidium light beam generated by said rubidium lamp, and having a photodiode for detecting resonance; the lamp assembly comprising:
a field coil in proximity to said lamp,
means for generating a periodic signal through said coil, and
means for heating said lamp to a selected operating temperature, said heating means having first and second heat generating devices connected in series for distributing said lamp heating function between said devices and around substantially the entire periphery of said lamp.

13. The lamp assembly recited in claim 12 wherein said first heat generating device is a transistor and wherein said second heat generating device is a heater blanket.

14. The lamp assembly recited in claim 13 wherein said heater blanket comprises:
an electrically conductive foil encased in an electrically non-conductive laminate material.

15. The lamp assembly recited in claim 14 wherein said foil is Inconel etched with Nichrome and wherein said laminate material is Kapton-impregnated fiberglass film.

* * * * *